United States Patent [19]

Wagenaar

[11] Patent Number: 4,695,865
[45] Date of Patent: Sep. 22, 1987

[54] INTEGRATED LOGIC CIRCUIT HAVING INSULATED GATE FIELD EFFECT TRANSISTORS

[75] Inventor: Kornelis J. Wagenaar, Nijmegen, Netherlands

[73] Assignee: U.S. Philips Corporation, New York, N.Y.

[21] Appl. No.: 719,950

[22] Filed: Apr. 4, 1985

[30] Foreign Application Priority Data

Apr. 9, 1984 [NL] Netherlands ................. 8401117

[51] Int. Cl.$^4$ ............................................. H01L 27/02
[52] U.S. Cl. ....................................... 357/41; 357/46; 357/92; 307/304
[58] Field of Search ............... 357/23.4, 41, 23.14, 357/36, 46, 92; 307/301, 303, 304

[56] References Cited

U.S. PATENT DOCUMENTS 4,219,828 8/1980 Lardy et al. ................. 357/23.14
4,412,242 10/1983 Herman et al. ................. 357/54

FOREIGN PATENT DOCUMENTS 0035453 9/1981 European Pat. Off. .
2011710 7/1979 United Kingdom .

Primary Examiner—Andrew J. James
Assistant Examiner—Mark Prenty
Attorney, Agent, or Firm—Robert T. Mayer; Steven R. Biren

[57] ABSTRACT

A semiconductor device includes insulated gate field effect transistors, with which logic gate circuits having a satisfactory switching speed and a high packing density can be realized. The logic gate circuits are composed of transistor structures having a common source zone (22), which each comprise a gate (33), a second semiconductor zone (25) and one or more drain zones (28) and are manufactured in DMOS technology. The gates are strip-shaped or have at least a strip-shaped part. The gate circuits can be integrated in a simple manner with one or more high-voltage transistors manufactured in DMOS technology.

12 Claims, 11 Drawing Figures

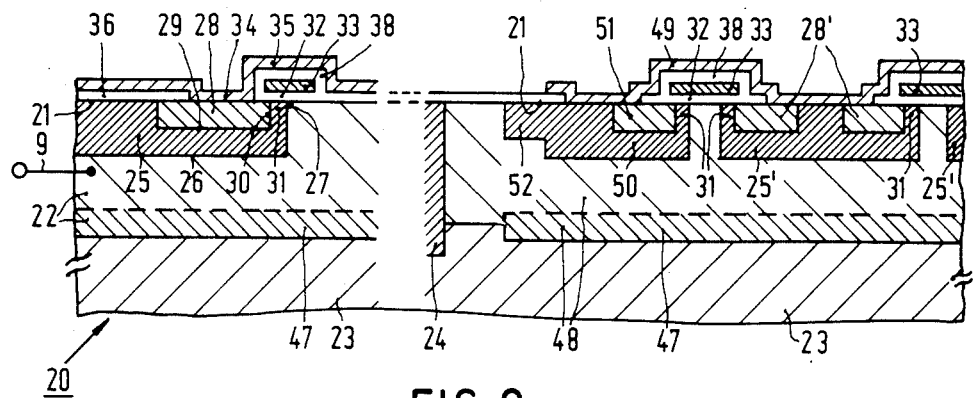
FIG. 9
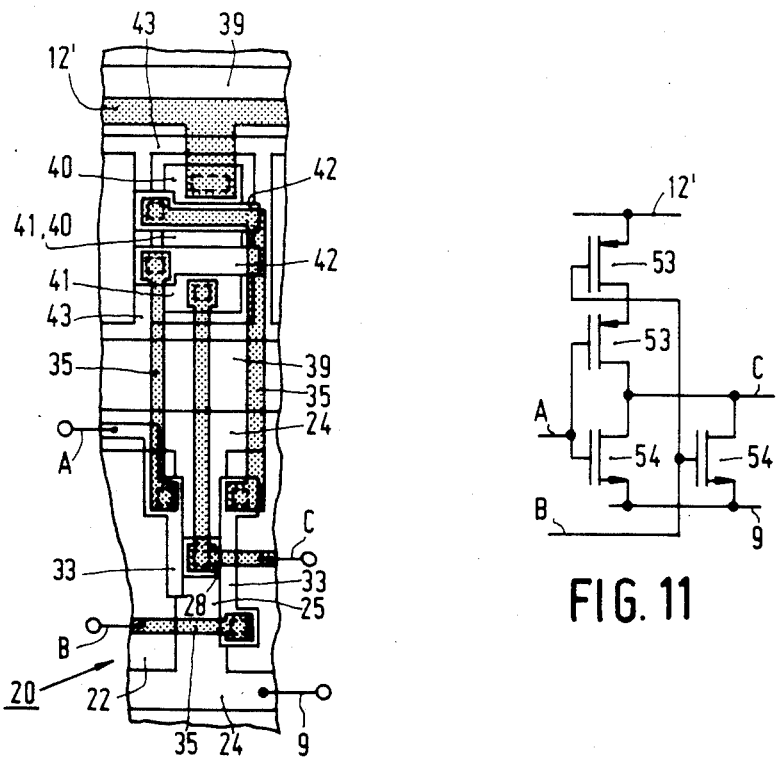
FIG. 10
FIG. 11

INTEGRATED LOGIC CIRCUIT HAVING INSULATED GATE FIELD EFFECT TRANSISTORS

BACKGROUND OF THE INVENTION

The invention relates to a semiconductor device comprising a semiconductor body having a major surface and a first semiconductor region of a first conductivity type, which adjoins this major surface and which constitutes a first electrode zone common to several transistor structures, which transistor structures have a second semiconductor zone of a second conductivity type opposite to the first conductivity type, which extends from the major surface in the semiconductor body down to a smaller depth than the first semiconductor region. The the second semiconductor zone forms with the first semiconductor region a first pn junction, which terminates at the major surface while forming at this major surface a first outer edge of the second semiconductor zone. Plural second electrode zones are present which are associated with the transistor structures and which are constituted by third surface zones of the first conductivity type, which are located within the second semiconductor zone are separated by a second pn junction from the second semiconductor zone, wherein the second pn junction terminates at the major surface while forming at the major surface a second outer edge of each of the third surface zone. Between each of the third surface zones and the common first electrode zone a channel region is present which underlies an insulating layer, each of the channel regions being separated by the insulating layer from a first conductive layer serving as an insulated gate, while the third surface zones are provided at the major surface with an electrical connection formed by a second conductive layer.

Such a semiconductor device is know from Dutch Patent Application No. 7812488, which has been laid open to public inspection since July 2, 1979 and corresponds to U.S. Pat. No. 4,208,530. The known device described therein is an integrated logic circuit, in which the second semiconductor zone in each of the transistor structures is common to two or more third surface zones, while the electrical connections of these third surface zones are separated from each other and form logic signal outputs, the transistor structures each having a single logic signal input.

The aforementioned known integrated circuit is constructed according to the VMOS technology. Each of the transistor structures is a logic gate circuit which has the second semiconductor zone as signal input. The first semiconductor region is a common source electrode and the signal outputs are the drain electrodes constituted by the third surface zones adjoining V-shaped grooves. A bias current is supplied to each of the signal inputs by means of a MOS transistor, which has a channel region which adjoins the major surface and is located between a further surface zone of the second conductivity type acting as a source zone and the second semiconductor zone acting as a drain zone. The insulated gates of these MOS transistors serving for the current supply are connected to the common source zone of the VMOS switching transistors.

The gate circuits described have a comparatively large capacitance between their logic signal input and the common source zone. The surface area of the relevant pn junction is comparatively large and moreover the voltage applied across this pn junction is very small. Furthermore, the first pn junction between this signal input and the common source zone can readily become conducting in the forward direction during operation. This results in current losses, while moreover the operation of the gate circuits thus can be relatively strongly dependent on the operating temperature of the integrated circuit.

The V-shaped grooves of the switching transistors and hence also the insulating layer serving as a gate dielectric and the insulated gates are formed after the various dopings have already been provided in the semiconductor body. This means that the drain zones have to be chosen so large that after etching the V-shaped grooves, even if the mask required for this etching is not aligned fully correctly, all drain zones are still sufficiently large in order that the electrical connection formed by the second conductive layer can be provided on this zone. Furthermore, the gates of the MOS transistors serving for the current supply are provided simultaneously with those of the VMOS transistors and consequently also after the doping treatments. As a result, these current-supply transistors occupy a comparatively large area, while they have a comparatively large capacitance between their gate and their drain zone.

SUMMARY OF THE INVENTION

The present invention has inter alia for its object to provide an integrated circuit, in which logic gate circuits having a satisfactory switching speed and a high packing density can be realized, while the voltage swing between the signals representing a logic "1" and a logic "0", respectively, can be chosen within comparatively wide limits.

The present invention is based inter alia in the recognition of the fact that use should be made of field effect transistors as driver transistors, which occupy a comparatively small area at the major surface of the semiconductor body and can be arranged so that they can be interconnected through a pattern of conductor tracks that can be formed in a comparatively simple manner. It is further also based on the recognition of the fact that it is necessary that the insulated gates of the driver transistors can be arranged as far as possible in a self-registered manner with respect to the semiconductor zones obtained by doping.

According to the invention, a semiconductor device of the kind described above, in which the second semiconductor zone in at least a first of the transistor structures is common to two or more third surface zones and in which the electrical connections of these third surface zones are separate from each other and form signal outputs, in which the first transistor structure has a common signal input associated with these signal outputs, is characterized in that the channel regions of the transistor structures are located at the major surface between the first and second outer edges and the second semiconductor zone of the first transistor structure is connected to the second semiconductor zone of one or more of the remaining transistor structures, while the signal inputs are constituted by the insulated gates of the transistor structures, the insulated gates having at least a strip-shaped part and one or more third surface zones being arranged along a long side of the strip-shaped part.

When the second semiconductor zones are connected to each other and/or to a point of reference potential and these semiconductor zones are consequently not used as signal inputs, it is achieved that the first pn junction does not adversely affect the switching speed and the temperature dependence and does not form a limitation for the voltage swing between the logic "1" and the logic "0".

For the sake of completeness, it should be noted that European Patent Application No. 35453 laid open to public inspection since Sept. 9, 1981 discloses integrated logic circuits comprising field effect transistors obtained by diffusion, having a common source electrode, plural gates and one or more drains. With these field effect transistors, gate circuits of the conventional type having plural logic inputs and a single logic output (multiple-in/single-out) are realized. Gate circuits of the type used in the aformentioned Dutch Patent Application No. 78 12488 having a single logic input and plural logic outputs (single-in/multiple-out), are not described in this European Patent Application.

In accordance with the present invention, the arrangement of the channel regions at the major surface affords the advantage that a self-registered technique can be used and that the first and second conductive layers are formed in separate operations. The electrical connection pattern thus consists of two pattern layers mutually separated by an insulating layer. The required connection pattern can thus be realized in a comparatively simple manner and can at the same time be compact. At any required point, crossing connections can be obtained without additional operations during the manufacture being required.

In connection with the aforementioned self-registered technique, which is also designated as DMOS technique, for the sake of completeness reference is made to British Patent Application No. GB 2087648, corresponding to U.S. Pat. No. 4,412,242. In this Application, FIGS. 10 and 11 show a prior-art semiconductor device of the kind described in the first paragraph of the present Application. A power transistor is concerned, in which in every second semiconductor zone one third surface zone is formed, which is connected by means of the second conductive layer common to all third surface zones to the adjoining second semiconductor zone. For this purpose, each third surface zone has an annular geometry, within which the second semiconductor zone extends as far as the major surface and is connected to the second conductive layer.

In accordance with the present invention it is advantageous that, without additional operations being required, one or more transistors of the kind described in British Patent Application No. GB 2087648 or of a comparable kind can be included in the semiconductor device according to the invention. The combination thus obtained of power transistor (or high-voltage transistors) and compactly integrated logic gate circuits is particularly attractive for a number of applications. The applications meant here are found inter alia in different fields, such as the field of telephony, driving of gas-filled tubes in display arrangements and electronic circuits for discharge lamps.

An important preferred embodiment of the semiconductor device according to the invention is inter alia for this reason characterized in that the semiconductor body has plural mutually-separated islands of the first conductivity type, which extend on a substrate region of the second conductivity type common to these islands, while one or more of these islands form part of a plurality of the transistor structures as the first semiconductor region and the common first electrode zone.

Preferably, one or more islands forming a common first electrode zone have a more heavily doped buried layer of the first conductivity type, which extends at and near the interface between the islands and the common substrate region.

A further important preferred embodiment is characterized in that a further island comprises a transistor having several substructures, which each have a second semiconductor zone of the second conductivity type, which is connected to a third surface zone of the first conductivity type, which is located within this second semiconductor zone, while the third surface zones of the substructures are interconnected through a common conductive layer and together constitute the second electrode zone of the transistor.

Preferably, the gates are strip-shaped or have at least a strip-shaped part, while one or more third surface zones are arranged along a long side of the strip-shaped part.

Channels having a comparatively large width/length ratio can be advantageously realized with a gate electrode, which is comb-shaped or at least has a comb-shaped part with projections which extend as teeth substantially at right angles to the strip-shaped base part of the comb-shaped part, while one or more interstices between adjacent projections accommodate a third surface zone, which fills the relevant interstice at least for the major part.

Preferably, several projections are arranged equidistantly, while a third surface zone is provided only in part of the interstics thus obtained. The non-occupied interstices may be used, where required, to accommodate a local widened part of the strip-shaped part of the gate, which widened part can be utilized to connect the gate in situ to a further conductor track.

In a further embodiment of the semiconductor device according to the invention, several gates are provided, whose strip-shaped parts are arranged beside each other and substantially parallel to each other. A considerable part of the required connections between signal inputs and signal outputs can then be realized by the use of conductor tracks, which extend at least mainly in a direction substantially at right angles to the strip-shaped parts of the gates.

Advantageously, at least one third surface zone is common to two transistor structures, while this surface zone, viewed on the major surface, extends from the strip-shaped part of the gate of one of these two transistor structures as far as the strip-shaped part of the gate of the other transistor structure. By the use of common third surface zones, a smaller number of connections for third surface zones are required.

In a further embodiment of the semiconductor device according to the invention, the interstices between two adjacent strip-shaped parts of the gates, viewed on the major surface, are alternately occupied by an essentially strip-shaped second semiconductor zone and by a strip-shaped part of the common first electrode zone. This arrangement is advantageous inter alia in connection with the series resistance in the common first electrode zone.

Preferably, plural second semiconductor zones form part of a common region of the second conductivity type. No separate electrical connections at the major surface are then required for these second semiconductor zones.

Advantageously, there extends at least near one of the ends of the strip-shaped parts of the gates in a direction substantially at right angles to these stripshaped parts a connection zone of the second conductivity type, which interconnects plural, essentially stripshaped second semiconductor zones. The first semiconductor region is preferably a part of a surface layer of the first conductivity type bounded by an isolation zone of the second conductivity type the in lateral direction (i.e. in direction substantially at right angles to the major surface), the connection zone and the isolation zone being united in the semiconductor body. In this embodiment, little or no additional surface area is required at the major surface for the connection zone, while the essentially strip-shaped second semiconductor zones, without additional steps being required, are moreover connected to the same point of reference potential as the common substrate region of the device.

BRIEF DESCRIPTION OF THE DRAWING

The invention will now be described more fully with reference to several embodiments and the accompanying diagrammatic drawing, in which:

FIG. 9 shows on an enlarged scale the extreme righthand part of FIG. 5 and in addition a diagrammatic cross-section of a part of the semiconductor device, which is not shown in the plan view of FIG. 4;

FIG. 10 shows diagrammatically a plan view of a part of a second embodiment of the semiconductor device according to the invention; and FIG. 11 shows a circuit diagram of a NOR gate realized in the last-mentioned part.

DESCRIPTION OF THE PREFERRED EMBODIMENTS

Figure 1:
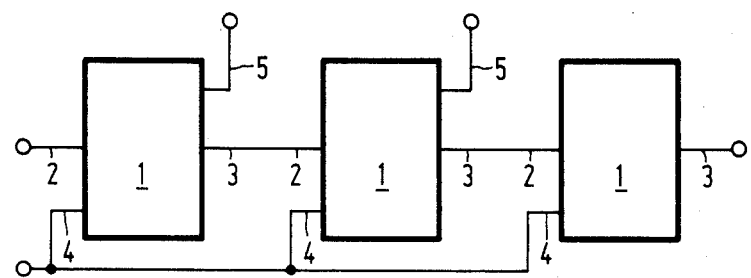
FIG. 1 shows a circuit diagram of a divide-by-eight circuit.

The first embodiment relates to an integrated circuit comprising a divide-by eight circuit, which according to the circuit diagram of FIG. 1 is composed of three divide-by-two circuits 1. The divide-by-two circuits have an input 2 and an output 3, the output 3 of a preceding divide-by-two circuit being connected to the input 2 of the next subsequent divide-by-two circuit. The divide-by-two circuits 1 each have a reset input 4. These reset inputs 4 are interconnected. Two of the divide-by-two circuits 1 are provided with an additional output 5.

Figure 2:
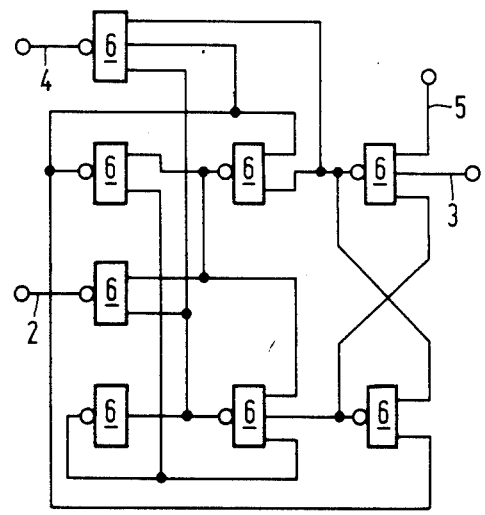
FIG. 2 shows a circuit diagram of a divide-by-two circuit composed of gate circuits.
Figure 3:
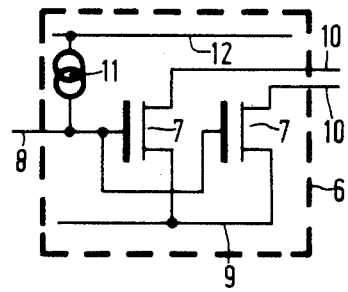
FIG. 3 shows a circuit diagram of a gate circuit used in the divide-by-two circuit shown in FIG. 2.

Each divide-by-two circuit 1 is composed of logic gate circuits 6 according to the circuit diagram of FIG. 2, each gate circuit 6 comprising, as shown in FIG. 3, a number of n-channel field effect transistors 7 equal to the number of outputs of the relevant gate circuit. The gates of the transistors 7 are connected to each other and to the common input 8 of the gate circuit. The sources of the transistors 7 are connected to a first supply line 9. The drains of the transistors 7 are each connected to one of the outputs 10 of the gate circuit 6. Furthermore, provision is made for means 11 for supplying current to the single input of the gate circuit 6. These means 11 are arranged between the single input 8 and a second supply line 12. They may be constituted, for example, by a resistor or a transistor or a diode. The operation of the gate circuits 6 is analogous to the operation of similar known gate circuits. For a description of the manner in which logic combinations of signals are realized with such gate circuits, reference may be made for the sake of brevity to the technical literature.

The integrated circuit of the first embodiment is a semiconductor device comprising a semiconductor body 20 (FIG. 4 to 9) having a major surface 21 and a first semiconductor region 22 of a first conductivity type adjoining this major surface 21. FIGS. 4 to 9 relate to a part of this semiconductor device, while in FIGS. 4 and 5 broken lines indicate that a part thereof has been left out.

In the present embodiment, the semiconductor body 20 is a silicon body having a p-type substrate region 23 and an n-type surface layer, which is subdivided by means of p-type separation zones 24 into islands which at least during operation of the semiconductor device are electrically isolated from each other. One of the said n-type island constitutes the first semiconductor region 22.

The first semiconductor region 22 constitutes a first electrode zone common to plural transistor structures, while these transistor structures have a second semiconductor zone 25 of a second conductivity type opposite to the first conductivity type, which extends from the major surface 21 in the semiconductor body 20 down to a smaller depth than the first semiconductor region 22. The second semiconductor zone 25 forms with the first semiconductor region 22 a first pn junction 26, which terminates at the major surface 21, while forming at this major surface a first outer edge 27 of the second semiconductor 25.

Furthermore, plural second electrode zones are present which are associated with the transistor structures and which are constituted by third surface zones 28 of the first conductivity type, which are located within the second semiconductor zone 25 and are separated from the adjoining second semiconductor zone 25 by a second pn junction 29. The second pn junction 29 terminates at the major surface 21, while forming at the major surface a second outer edge 30 of each of the third surface zones 28.

Between each of the third surface zones 28 and the common first electrode zone 22 there is provided a channel region 31. One of these channel regions 31 is indicated in the lefthand part of FIG. 9, in which the extreme righthand part of FIG. 5 is shown again on an enlarged scale for the sake of clarity. The various dimensions in this part of the device are not enlarged to scale.

Each of the channel regions 31 adjoins an insulating layer 32 and is separated by this insulation layer 32 from a first conductive layer 33 serving as a gate. The third surface zones 28 are provided at the major surface 21 with an electrical connection 34 formed by a second conductive layer.

The second semiconductor zone 25 is common in at least a first of the transistor structures to two or more third surface zones 28, while the electrical connections 34 of these third surface zones 28 are mutually separate and constitute signal output 10. The transistor structure each have a single signal input 8.

According to the invention, the channel regions 31 of the transistor structures are located at the major surface 21 between the first and second outer edges 27 and 30, respectively, and the second semiconductor zone 25 of the first transistor structure is connected to the second semiconductor zone 25 of one or more of the remaining transistor structures. In the present embodiment, all second semiconductor zones 25 are interconnected via the separation zone 24 linking-up with these zones. Furthermore, the signal inputs are constituted by the insulated gates 33 of the transistor structures.

Each of the transistor structures having a second semiconductor zone 25, plural third surface zones 28 and a common insulated gate 33 comprises the n-channel transistors 7 of a gate circuit 6. The common gate 33 forms the signal input 8; the third surface zones 28 are drain electrodes; the connections 34 of the third surface zones 28 form the outputs 10 and the first semiconductor region 22 forms a source electrode which is common to all transistors of the gate circuits and which is connected to the connection 9 indicated diagrammatically in FIGS. 4, 5, 6 and 9. This connection 9 indicated diagrammatically represents at the same time the first supply line.

Figure 4:
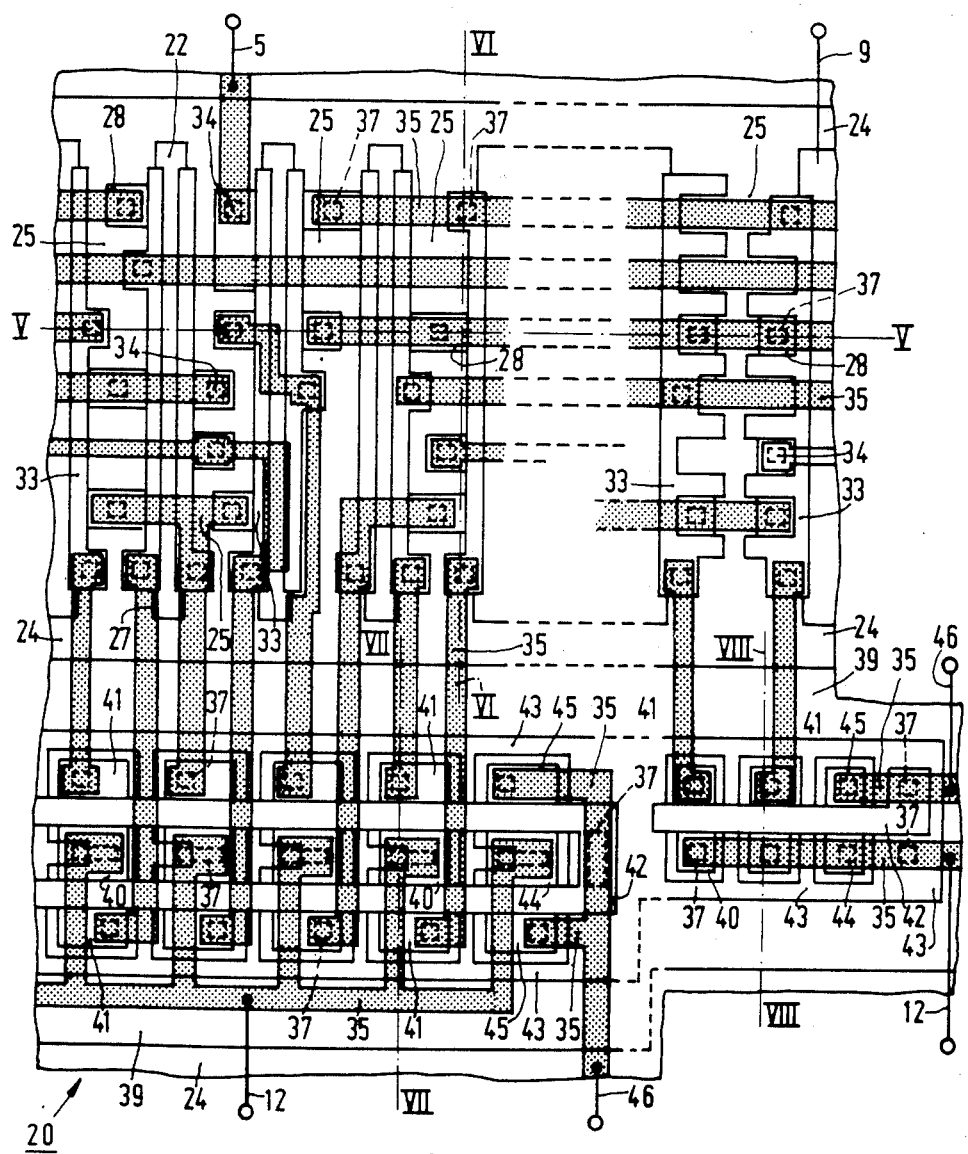
FIG. 4 shows diagrammatically part of a plan view of a first embodiment of the semiconductor device according to the invention.
Figure 5:
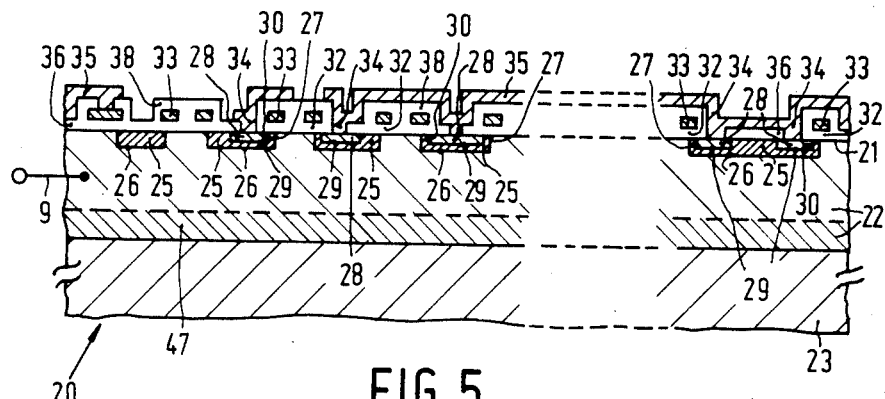
FIGS. 5 to 8 show diagrammatically cross-sections of the semiconductor device shown in FIG. 4, taken on the lines V—V, VI—VI, VII—VII and VIII—VIII, respectively.
Figure 6:
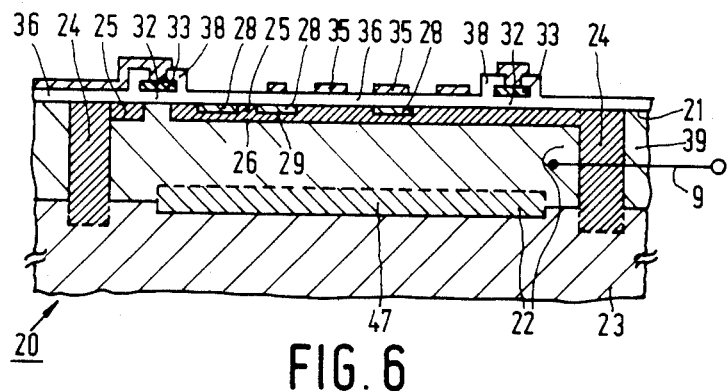
Figure 7:
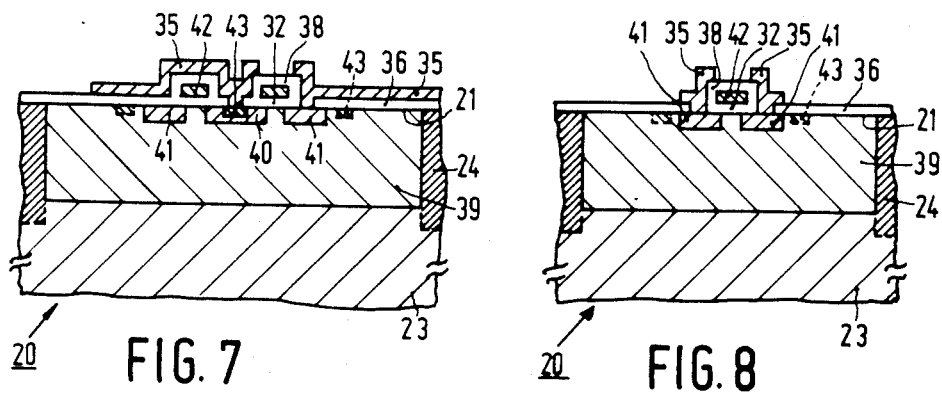
Figure 8:
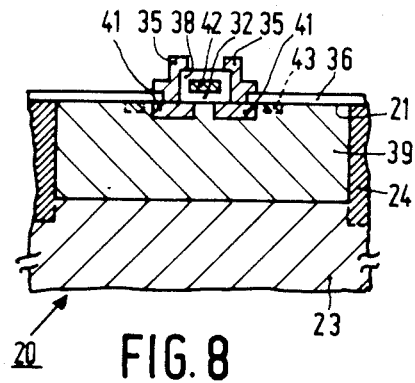

The electrical connections 34 form part of conductive tracks 35, which are isolated from the semiconductor surface by an insulating layer 36 and which are connected in openings in this insulating layer, which are indicated in FIG. 4 by squares 37 shown in broken lines, to the third surface zones 28. Furthermore, the gates 33 are covered by an insulating layer 38, as a result of which the conductive tracks 35 can cross the gates 33. Where desired, conductive tracks 35 are connected through openings 37 in the insulating layer 38 to a gate 33.

Each of the gates 33 is connected by means of a conductive track 35 to means for supplying current, which comprise in this embodiment a number of p-channel transistors which are arranged in current mirror configuration and which are provided in a second island 39. In the lefthand part of FIG. 4, a current mirror configuration is shown, in which the p-channel transistors each have a source zone 40 and a drain zone 41. Each of these transistors is surrounded at the major surface 21 by a channel stopper zoner 43. The p-channel transistors have a common insulated gate 42. The p-channel transistor having a source zone 44 and a drain zone 45 is connected as a diode. The two subzones 45 are connected to the gate 42 through a conductive track 35. All source zones 40 and 44 are connected through a conductive track 35 to each other and to a connection 12 shown diagrammatically and representing the second supply line. At the area of the source zones 40 and 44, the last-mentioned conductive track 35 is also connected to the channel stopper zone 43. The gate 42 and the subzones 45 are connected to a connection 46 shown diagrammatically. This connection 46 may be connected, for example, in a usual manner to a reference current source. Each of the drain zones 41 is connected to one of the gates 33 of the transistor structure.

In the righthand part of FIG. 4, a similar current mirror configuration is shown, in which the p-channel transistors are arranged differently. Which arrangement is to be preferred will depend upon the relative dimensions of the gate circuits with respect to the p-channel transistors. In this configuration, the p-channel transistor connected as a diode has a single drain zone 45. In this case, the connection of the channel stopper zone 43 with the conductive track 35 leading to the connection 12 is also of single construction. The relevant opening 37 in the insulating layer 36 is located in FIG. 4 beside the three source zones 40 and 44 shown of this configuration and on one line with the openings 37 located above these source zones 40 and 44.

Instead of the current mirror configurations shown, other means for supplying current may also be used. Thus, the gates 33 may, for example, each be connected through a resistor to the supply line 12. Such resistors may be integrated in or on the same semiconductor body 20. For example, these resistors may be in the form of parts of the same polycrystalline semiconductor layer from which the gates 33 are obtained. In such a polycrystalline semiconductor layer, also p-channel transistors for supplying current may be realized in known manner. Furthermore, the current supply may also be realized by means of bipolar pnp transistors. These bipolar pnp transistors may be provided, for example, in the same island 22 as then n-channel transistors. Preferably, for the bipolar pnp transistors use is also made of a second island 39 isolated from the first island 22. In this case, there is a larger freedom in the choice of the desired value of the supply voltage.

The N-channel transistors need not necessarily be arranged in an isolated island 22. The semiconductor body 20 may also be constituted by a comparatively heavily doped n-type substrate region, on which a comparatively weakly doped n-type surface layer is disposed. Preferably, however, the transistor structure 22, 25, 28, 33 are located in one or more first semiconductor regions 22 which are separated from the remaining part of the semiconductor body, these first semiconductor regions 22 extending on a common substrate region 23 of the second conductivity type, while a more heavily doped buried layer 47 of the first conductivity type is present at and near the interface between such a semiconductor region 22 and the common substrate region 23.

The preferred embodiment described above has inter alia the advantage that other circuit elements and circuits in isolated islands can be integrated in the same semiconductor body. In addition to resistors, diodes or bipolar transistors (npn and/or pnp transistors), high-voltage or power transistors in DMOS technology may also be used. Especially since the transistor structure according to the invention can be combined in a comparatively simple manner with known other circuit elements in the same semiconductor body, the field of application of the semiconductor device according to the invention is very wide. Possible applications include inter alia the field of telephony, the driving of gasfilled tubes in display arrangements and electronic circuits for discharge lamps. The said applications often require the use of high-voltage transistors. For illustration, in the righthand part of FIG. 9 there is diagrammatically indicated in cross-section that a known high-voltage transistor for larger currents can also be included in the semiconductor body 20. This high-voltage transistor is not visible in the part of the plan view of the semiconductor device shown in FIG. 4.

The high-voltage transistor is located in a further island 48 (FIG. 9), which is provided with the buried layer 47. The island 48 is bounded in the lateral direction (i.e. the directions substantially parallel to the major surface) by an isolation zone 24. The high-voltage transistor is constructed in DMOS technology and comprises several substructures, which each have a second semiconductor zone 25' of the second conductivity type, which is connected to a third surface zone 28' of the first conductivity type located within this second semiconductor zone 25'. The third surface zones 28' have an annular or at least a closed geometry, while at the center of each substructure the second semiconductor zone 28' extends as far as the major surface 21. By means of a common conductive layer 49, the second semiconductor zones 28' in the central part of the substructure are connected to the third surface zones 28', while this conductive layer 49 moreover interconnects all third surface zones 18'. The interconnected surface zones 28' form the source zone of the high-voltage transistor. The island 48 is the drain zone. The high-voltage transistor further has a number of channel regions 31, which are separated by the insulating layer 32 from the gate 33 common to all substructures of the transistor.

The pattern of substructures 25', 28' is surrounded by a semiconductor zone 50 of the second conductivity type, which has a closed geometry. In the present embodiment, a semiconductor zone 51 of the first conductivity type is provided at the edge of this semiconductor zone 50 facing the pattern of substructures in this zone. The zones 50 an 51 are both connected to the common conductive layer 49. At the edge of the semiconductor zone 50 remote from the pattern of substructures, a more weakly doped edge zone 52 of the second conductivity type is provided, as a result of which a comparatively high breakdown voltage can be obtained in known manner between the p-type zones 25', 50 and the drain zone 48.

The source zone 28' can be provided simultaneously with the drain zones 28. The semiconductor zones 25' and 50 can be provided simultaneously with the second semiconductor zones 25 of the transistor structures. The common condjuctive layer 49 is formed simultaneously with the conductive tracks 35. The drain zone 48, 47 can be provided in a usual manner at a suitable area beside the pattern of substructures 25', 28', 50, 51 at the major surface 21 with a connection not shown. For this purpose, for example, a more heavily doped contact zone of the first conductivity type may be provided, which extends from the major surface substantially as far as or into the buried layer 47 of the transistor. The island 22 may also be provided at one or more suitable areas in a similar manner with a connection, which in this case is connected to the first supply line 9.

A clear difference between the transistor structure 22, 25, 28 and the substructure 48, 25', 28' is that in the last-mentioned substructure the first and the second outer edge of the zone 25' and the zone 28', respectively, limit throughout their length a channel region 31 and extend throughout their length substantially parallel to each other, while this is not the case in the transistor structures 22, 25, 28. In the transistor structures, the second outer edge 30 of each third surface zone 28 extends only over part of its length at a comparatively small distance substantially parallel to a part of the first outer edge 27 of the relevant second semiconductor zone 25. Only between these parts of the first and second outer edges 27 and 30 extending at a comparatively small relative distance and substantially parallel to each other, channel regions 31 are present, which can be controlled by the gates 33. It holds for the width of the channel regions 31 that it is smaller than the length of the second outer edge 30 of the third surface zone 28 adjoining the relevant channel region 31. This also means that the second outer edge 30 follows only locally over part of its length an edge of the associated gate 33. This also preferably holds for the first outer edge 27, but here it is not always necessary.

The transistor structures may have different geometries. In connection with the desired simplicity of the pattern of conductor tracks required for the interconnections, the gates 33 of the substructures preferably have at least an elongate or strip-shaped part and the third surface zones 28 are arranged on the same line along at least one long side of the strip-shaped part. The gates 33 shown in the lefthand part of FIG. 4 are substantially entirely strip-shaped and have one or more locally widened parts for connection with a conductive track 35. The gates shown in the righthand part of FIG. 4 have a stripshaped part, which forms the base part of a comb structure, projections in the form of teeth of this comb extending substantially at right angles to the strip-shaped part. The third surface zones 28 are arranged in interstices between adjacent projections so that they are embraced on three sides by the comb-shaped gate 33. This geometry may be advantageously if it is necessary that the circuit can be operated at a comparatively high current level. The relevant interstices are filled at least for the major part with the third surface zones 28 arranged therein. The interstice may also be completely filled an the third surface zone 28 may also extend beyond the ends of the projections. If two comb-shaped gates are arranged beside each other with facing projections or teeth, two interstices located opposite each other may be filled, for example, with a third surface zone extending from gate to gate instead of using two separate third surface zones which are interconnected via a conductive track 35. Preferably, plural projections or teeth are arranged substantially equidistantly, while a third surface zone is arranged only in part of the interstices thus obtained and one or more other insterstices are left unoccupied. Also in this embodiment, the strip-shaped base part of the comb-shaped gate 33 has one or more locally widened parts for connection with a conductive track 35. Preferably, one or more of such widened parts are provided at areas of interstices between the projections which are not occupied by third surface zones 28.

Advantageously, plural gates 33 are present, whose strip-shaped parts are arranged beside each other and substantially parallel to each other, as shown in FIG. 4. In this embodiment of FIG. 4, several connections 34 of third surface zones 28 form part of conductive tracks 35, which extend at least over a considerable part of their length in a direction substantially at right angles to the strip-shaped parts of the gates 33 and cross at least one of these gates 33. In connection with these crossing, several of the gates 33 are connected at at least two points to conductive tracks of the second level, while between these points at least one conductive track of the second level crosses the relevant gate 33 The semiconductor device therefore has a connection pattern which is formed from conductive tracks and which has a first level and a second level separated therefrom by the insulating layer 38, the gates 33 belonging to the first level and extending at least mainly in a direction substantially parallel to each other, while the second level has conductive tracks 35 which extend substantially at right angles to the direction of the gates 33 and are connected to one or more third surface zones 28 and/or to one or more gates 33. Thus, a large number of crossings of conductive tracks can be obtained in a simple manner, as a result of which the required connection pattern can be comparatively compact and occupies a comparatively small amount of surface area at the surface of the semiconductor body.

In the embodiment of FIG. 4, a number of seven equidistant positions are available for connections 34 of third surface zones 28 and connections of gates 33 in the longitudinal direction of the strip-shaped parts of the gates 33. Also most of the conductive tracks 35 and especially the conductive tracks 35 extending substantially at right angles to the strip-shaped parts of the gates 33 can be arranged in these positions. As shown in FIG. 4, these conductor tracks 35 do not occupy completely the positions available. In the space available between two of these conductor tracks 35, which are arranged in the same position, connections to third surface zones 28 or gates 33 can be realized and, where required, such unoccupied parts of positions can be used to arrange conductive tracks 35 extending in a direction other than at right angles to the strip-shaped parts of the gates 33. The use of regularly-arranged positions in one direction together with strip-shaped parts of the gates 33 arranged regularly and in the other direction results in a comparatively simple pattern of connection conductors, which is particularly suitable to promote the designing of such semiconductor devices with computes. The simplicity of the pattern of conductive tracks located above the transistor structure is favored by the fact that this pattern comprises only signal-conveying gates 33, connections thereof, connections of third zones 28 and connection leads between such connections. The second semiconductor zones 25 are internally interconnected in the semiconductor body 20 so that no space need be reserved in the said pattern for connection of these second semiconductor zones 25. This advantage, that the pattern of connection conductors located above the transistor structures comprises only signal-conveying conductive tracks, is also attained if the second semiconductor zones 25 extend in the semiconductor body beyond this pattern and in situ have an electrical connection, by means of which they can be connected to each other and to a point of reference potential. Preferably, however, several second semiconductor zones 25 form part of a common region 24, 25 of the second conductivity type.

The second semiconductor zones 25 may be obtained, for example, by providing a doping through a common large opening in a doping mask, while there are present inside this opening a number of gates 33, which also constitute a masking against doping. Thus, for example, a continuous region of the second conductivity type is obtained, which has at the major surface 2 plural recesses (apertures), which are covered entirely or substantially entirely by gates 33. Third surface zones 28 can be arranged over the whole length of the edges of the gates 33, over which length these edges follow the edges of the recesses. The dimensions of the recesses and consequently also the dimensions of gates 33 can influence the internal series resistance in the common first electrode zone 22. In the case of narrow strip-shaped gates 33, the first electrode zone 22 under the gate will extend only in a narrow and small surface portion to the major surface 21.

Preferably, the gates 33 have strip-shaped parts, while in the interstice between two adjacent strip-shaped parts, viewed on the major surface, alternately an essentially strip-shaped second semiconductor zone 25 and a strip-shaped surface portion of the common first electrode zone 22 are arranged. In this embodiment, the strip-shaped parts of the gates 33 can be made narrow without the series resistance in the first electrode zone 22 being increased thereby, with the use of very narrow strip-shaped parts, the series resistance of the gates 33 may be larger than is desirable. Thus, for example, the switching speed of the gate circuits may be adversely affected.

Each essentially (i.e. apart from the recesses obtained due to the fact that the gates 33 are locally widened) strip-shaped second semiconductor zone 25 is common to two transistor structures and the third surface zones 28 are each time arranged along only one of the long sides of each of the strip-shaped parts of the gates 33.

The essentially strip-shaped second semiconductor zones 25 can each be electrically connected at a suitably chosen location to the common source zone 22.

Advantageously, several essentially strip-shaped second semiconductor zones 25 form part of a common region 24, 25 of the second conductivity type, while at least near one of the ends of the strip-shaped parts of the gates 33 a connection zone 24 of the second conductivity type extends in a direction at right angles to the strip-shaped parts. The common region 24, 25 may be comb-shaped, the connection zone 24 then forming the base part (the back) of the comb and the essentially strip-shaped second semiconductor zones 25 extending as projections or teeth at right angles to the base part 24. An additional connection zone may be formed in the comb structure in a manner such that the common region 24, 25 becomes ladder-shaped. Near both ends of the strip-shaped parts of the gates 33, a connection zone 24 is now present. The two connection zones 24 constitute the ladder beams of the ladder-shaped structure, while the essentially strip-shaped second semiconductor zones 25 form the rungs of the ladder-shaped structure. In the embodiment of FIG. 4, the common region 24, 25 is ladder-shaped.

In an important preferred embodiment, the first semiconductor region 22 is a part of a surface layer of the first conductivity type bounded in the lateral direction by an isolation zone 24 of the second conductivity type and the connection zone and the isolation zone are united in the semiconductor body. If the connection zone is provided simultaneously with the essentially strip-shaped semiconductor zones 25, the connection zone and the isolation zone can overlap each other at the major surface and can thus be united. In the embodiment of FIG. 4, the isolation zone 24 acts at the same time as a connection zone. Thus, no additional surface area at the major surface 21 is required for the connection zones. The combination of connection zone and isolation zone further has the advantage that no separate connection is required for the second semiconductor zones 25. By means of the isolation zone 24, they are connected to the same point of reference potential as the substrate region 23. This reference potential will substantially also be applied to the first semiconductor region 22.

In the semiconductor device according to the invention logic gate circuits may also be realized in CMOS technology. FIG. 10 shows by way of example diagrammatically a plan view of a NOR gate having two inputs A and B and an output C according to the circuit diagram of FIG. 11. The gate circuit has two p-channel transistors 53 series-connected with their main current paths and connecting the supply line 12' to the output C. These p-channel transistors have source and drain zones 40 and 41 and a gate 42 and are provided in an island 39. They are comparable with the p-channel transistors of the current mirror configurations of the first embodiment. The gate circuit further has two n-channel transistors 54 parallel-connected with their main current paths and connecting the output C with the supply line 9. These n-channel transistors 54 are comparable with the n-channel transistors 7 of the first embodiment. They have a common source zone 22, which is surrounded in lateral direction by a p-type isolation zone 24. A common p-type second semiconductor zone 25 extends in this common source zone. Furthermore, the n-channel transistors each have a gate 33 with a strip-shaped part and a common third surface zone 28, which constitutes the common n-type drain zone. This third surface zone 28 extends, viewed on the major surface, as a continuous zone from the strip-shaped part of one gate 33 to the strip-shaped part of the other gate 33. The input A is connected to a conductive track of the first level, to which belong also the gates 33, and the input B is connected to a conductive track 35 of the second level. The semiconductor device can comprise many CMOS gate circuits, while all p-channel transistors can be provided in a common island 39 and all n-channel transistors can be provided in a common island 22. The gate circuits can be compact, while, as shown in FIG. 10, crossing connections can be realized in a simple manner.

The embodiments described can be manufactured entirely by means of techniques and treatments known in the semiconductor technology. In this manufacture, the starting material may be, for example a p-type silicon substrate 23 having a resistivity of about 30Ω .cm. At a surface of this substrate 23, a doping for the buried layers 47 can be provided by implantation of, for example, As or Sb. Subsequently, an n-type epitaxial layer can be formed, which may have, for example, a thickness of about 20 μm and a resistivity of about 10Ω .cm. In a usual manner, this epitaxial layer is subdivided by boron-doped isolation zones 24 into islands 22, 39 and 48. If desired, deep phosphorus-doped zones for a good conducting connection of one or more buried layers 47 may then be diffused from the major surface 21.

After the silicon oxide present above the islands 22, 39 and 48 has been entirely removed from the major surface 21, an insulating layer 32 can be obtained by oxidation, which will serve locally as a gate dielectric of the field effect transistor. A layer of polycrystalline or amorphous silicon is provided over this oxide layer 32 and this layer of polycrystalline or amorphous silicon can be doped with phosphorus during deposition or thereafter. This deposited semiconductor layer is patterned in a usual manner in order to obtain therefrom the gates 33 and any further conductive tracks of the first level.

Subsequently, parts of the insulating layer 32 not covered by conductor tracks can be removed and boron can be implanted at a dose of preferably about $10^{12}$ ions/cm$^2$. This doping is suitable for obtaining the edge zone 52 of the high-voltage and/or power DMOS transistor in the island 48. During this implantation treatment, a doping mask of photolacquer may also be used. This doping may also be implanted, without parts of the insulating layer 32 first being removed, locally through this thin insulating layer 32 into the semiconductor body 20. This doping treatment may be carried out only at the area of the edge zone 52 or also at the area of all p-type surface zones 25, 25', 40, 41 and 50. If the semiconductor device moreover comprises p-channel transistors for use at higher voltages, this doping may also be used to provide a p-type connection zone forming part of the drain zone and more weakly doped between the channel region and a more heavily doped p-type surface portion of the drain zone of this transistor.

After this doping treatment, a fresh doping mask is arranged, which is provided in a usual manner with openings for the p-type zones 25, 25', 40, 41 and 50. Boron may be used as a dopant for these zones. The sheet resistance of these zones is, for example, about 300Ω/□. The doping is diffused by means of a usual heat treatment down to the desired depth into the semiconductor body 20.

The last-mentioned doping mask comprises in a usual manner the gates 33 or parts thereof. If desired, these gates 33 may be previously provided with a protecting insulating and/or masking layer. For this purpose, the gates 33 may, for example, be first oxidized and/or a layer of silicon oxide, silicon nitride or silicon oxynitride may be formed on the deposited semiconductor layer in a usual manner before the latter layer is patterned. If required, a thin oxide layer is additionally provided below a nitride or oxynitride layer.

Besides the gates 33, this doping mask comprises an oxide layer an/or a photolacquer layer, in which openings are provided. The openings intended for the second semiconductor zones 25 are then preferably strip-shaped. The long sides of these strip-shaped openings preferably extend at least in part in the longitudinal direction over the strip-shaped parts of the relevant gates 33. Moreover, these strip-shaped openings preferably overlap an already provided isolation zone 24 near one or both narrow ends.

After this doping and diffusion treatment, the whole active region of the semiconductor body is covered, as usual, with an oxide layer and a fresh doping mask can be arranged. The photolacquer layer provided for this purpose has openings for the n-type semiconductor zones 28, 28', 43 and 51. The openings for the zones 28 of the n-channel transistors 7 and 54 overlap the relevant gates 33 so that parts of these gates 33 also define the utimate doping opening in the doping mask. The edges of the openings in the photolacquer layer consequently extend in part over the gates 33. Preferably, they extend in part over the strip-shaped parts of the gates 33 in the longitudinal direction thereof. The zones 28 are provided in a self-registered manner with respect to parts of the edges of the gates 33. The doping of the n-type zones 28, 28', 43 and 51 may also be provided, if desired, in the surface portion of the common source zone, which in the embodiment of FIG. 4 extends between two adjacent strip-shaped parts of gates 33 as far as the major surface 21.

As a dopant, use may be made, for example, of phosphorus or arsenic. This dopant can be provided by implantation or by means of a usual diffusion treatment after the oxide layer has been etched and the photolacquer layer has been removed.

After the n-type surface zones have been obtained, an insulation layer 38 can be deposited, for example from the vapor phase or by plasma deposition. Subsequently, openings 37 for electrical connections can be etched and a conductive layer of, for example, aluminum can be deposited. This conductive layer is patterned for forming the conductive tracks 35 of the second level. Subsequently, the semiconductor device can be coated with a protective layer (not shown) of, for example, oxide and/or nitride. Finally, the semiconductor devices can be finished in a usual manner and be provided in a conventional envelope.

The packing density of the logic circuits, as shown in the lefthand part of FIG. 4, may be, depending upon the dimensions used, about 100 to 200 gates per mm². with openings 37 of about 6 μm×6 μm, a minimum distance between details in various masks of about 4 μm and a minimum track width of 6 μm for the gates 33 and the conductive tracks 35, the packing density is about 150 gates per mm². The width/length ratio of the channels of the p-channel transistors is, measured on the masks, about 14 and actually in the semiconductor device about 18. For the p-channel transistors of the current source configuration, a width/length ratio measured on the masks of about 2.6 was used. Actually, this ratio is in the semiconductor device about 5. The packing density can be improved by about 20 to 30% by using instead of the current source configuration, for example, resistors realized in the deposited semiconductor layer to form the current source of the gate circuits.

The present invention is not limited to the embodiments described. Within the scope of the invention, many variations are possible for those skilled in the art. For example, instead of silicon, other semiconductor materials, such as germanium of $A^{III}$-$B^V$ compounds, may be used. As a material for the insulating layers, for example, silicon nitride or silicon oxynitride may also be used instead of the said silicon oxide. The insulating layer 38 may be obtained instead of by deposition also by thermal generation. When providing the polycrystalline semiconductor layer, the fact may in this case be taken into account that a part of this layer is converted into oxide during thermal generation.

Instead of a deposited semiconductor layer, a suitable metal layer, such a molybdenum layer or a tungsten layer, may also be used for the conductive tracks and the gates of the first level. Furthermore, a suitable silicide layer may be provided or the semiconductor layer may be coated with a silicide layer or may be converted entirely or in part into a silicide layer.

Moreover, the indicated conductivity types may be interchanged and, dependent upon the use and the manufacturing process available, for example other than the indicated width/length ratios may be used for the field effect transistors. In the semiconductor device, n-channel transistors with different width/length ratios may be used beside each other. In the embodiment of FIG. 4, the transistor connected to the additional output 5 has a larger width/length ratio, as a result of which this transistor can convey a larger current than the remaining transistors. In the embodiments described, the supply voltage between the supply lines 9 and 12 and 9 and 12', respectively, may also be chosen within a comparatively large range of from, for example, one or a few Volts to, for example, about 10 Volts. A particularly suitable supply voltage for the gate circuits used in the first embodiment is, for example, about 5 V. The current consumption of these gate circuits can vary from an average value of 20 nA to, for example, an average value of 20 μA per gate. The measured delay times per gate varied in this current intensity range from about 2.5 μsec to about 20 nsec. These values can differ considerably from manufacturing process to manufacturing process. For example, the logic gate circuits may also be used in integrated circuits having a considerably thinner epitaxial layer, as a result of which a lower series resistance will occur in the common first electrode zone 22.

The doping concentration of the epitaxial layer also influences this series resistance.

What is claimed is:

1. A semiconductor device comprising a semiconductor body having a plural transistor structure, a major surface and a first semiconductor region of a first conductivity type which adjoins said major surface and which comprises a first electrode zone common to said plural transistor structure, which transistor structure comprises a second semiconductor zone of a second conductivity type opposite to the first conductivity type which extends from the major surface into the semiconductor body down to a smaller depth than that of the first semiconductor region, the second semiconductor zone forming with the first semiconductor region a first pn junction which terminates at the major surface while forming at this major surface a first outer ede of the second semiconductor zone, third surface zones of the first conductivity type, plural second electrode zones associated with the transistor structures and formed by said third surface zones of the first conductivity type, located within the second semiconductor zone and separated by second pn junction from the second semiconductor zone, said second pn junctions terminating at the major surface while forming at said surface a second outer edge of each of the third surface zones, channel regions between each of the third surface zones and the common first electrode zone, an insulating layer adjoining said channel regions, and a first conductive layer serving as an insulated gate, each of the channel regions being separated by the insulating layer from said first conductive layer, a second conductive layer, said third surface zones being provided at the major surface with an electrical connection formed by said second conductive layer, the second semiconductor zone in at least a first of the transistor structures being common to two or more third surface zones and the electrical connection of these third surface zones being separated from each other and forming signal outputs, the first transistor structure having a common signal input associated with said signal outputs, characterized in that the channel regions of the transistor structures are located at the major surface between the first and second outer edges, the second semiconductor zone of the first transistor structure is connected to the second semiconductor zone of at least one of the remaining transistor structures, and the signal inputs comprise the insulated gates of the transistor structures, the insulated gates having at least a strip-shaped part and one or more third surface zones being arranged along a long side of the strip-shaped part.

2. A semiconductor device as claimed in claim 1 and having a substrate region of the second conductivity type, characterized in that the semiconductor body comprises plural mutually-separated islands of the first conductivity type, which extend on said substrate region of the second conductivity type common to these islands, one or more of these islands forming part of a plurality of the transistor structures as the first semiconductor region and the common first electrode zone.

3. A semiconductor device as claimed in claim 2, characterized in that at least one island forming a common first electrode zone comprises a more heavily doped buried layer of the first conductivity type, which extends adjacent the interface between the island and the common substrate region.

4. A semiconductor device as claimed in claim 3, characterized in that a further island is provided which comprises a transistor having plural substructures, which each have a second semiconductor zone of the second conductivity type which is connected to a third surface zone of the first conductivity type located within this second semiconductor zone, the third surface zones of the substructure being interconnected through a common conductive layer and together comprising the second electrode zone of the transistor.

5. A semiconductor device as claimed in claim 1, 2, 3 or 4, characterized in that at least one gate has a comb-shaped part with projections which extend as teeth substantially at right angles to the strip-shaped base part of the comb-shaped part, while there is arranged in one or more interstices between adjacent projections a third surface zone which fills th relevant interstice at least for the major part.

6. A semiconductor device as claimed in claim 5, characterized in that plural projections are provided which are arranged equidistantly, a third surface zone being provided which is arranged only in part of the interstices thus obtained.

7. A semiconductor device as claimed in claims 1, 2, 3 or 4, characterized in that plural gates are provided, whose strip-shaped parts are arranged beside each other and substantially parallel to each other.

8. A semiconductor device as claimed in claim 7, characterized in that at least a third surface zone is provided which is common to two transistor structures, this third surface zone, viewed on the major surface, extending from the stripshaped part of the gate of one of these two transistor structures to the strip-shaped part of the gate of the other transistor structure.

9. A semiconductor device as claimed in claim 7, characterized in that the interstices between two adjacent strip-shaped parts, viewed on the major surface, are alternately occupied by an essentially strip-shaped second semiconductor zone and by a strip-shaped surface portion of the common first electrode zone.

10. A semiconductor device as claimed in claim 1, 2, 3 or 4, characterized in that plural second semiconductor zones form part of a common region of the second conductivity type.

11. A semiconductor device as claimed in claim 9, characterized in that a connection zone of the second conductivity type extends at least near one of the ends of the strip-shaped parts of the gates in a direction substantially at right angles to these strip-shaped parts.

12. A semiconductor device as claimed in claim 11, characterized in that the first semiconductor region is a part of a surface layer of the first conductivity type bounded in the lateral direction by an isolation zone of the second conductivity type, the connection zone and the isolation zone being united in the semiconductor body.

* * * * *